US012353715B2

(12) United States Patent
Srikanth et al.

(10) Patent No.: US 12,353,715 B2
(45) Date of Patent: Jul. 8, 2025

(54) NEAR-MEMORY ENGINE FOR REDUCING BANDWIDTH UTILIZATION IN SPARSE DATA APPLICATIONS

(71) Applicant: Advanced Micro Devices, Inc., Santa Clara, CA (US)

(72) Inventors: Sriseshan Srikanth, Austin, TX (US); Vignesh Adhinarayanan, Austin, TX (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 878 days.

(21) Appl. No.: 17/490,909

(22) Filed: Sep. 30, 2021

(65) Prior Publication Data

US 2023/0102690 A1    Mar. 30, 2023

(51) Int. Cl.
*G06F 3/06*    (2006.01)

(52) U.S. Cl.
CPC .......... *G06F 3/0611* (2013.01); *G06F 3/0659* (2013.01); *G06F 3/0679* (2013.01)

(58) Field of Classification Search
None
See application file for complete search history.

(56) References Cited

U.S. PATENT DOCUMENTS

| | | | |
|---|---|---|---|
| 9,286,216 B2 | 3/2016 | Franchetti et al. | |
| 10,180,928 B2 | 1/2019 | Nurvitadhi et al. | |
| 10,901,492 B1 * | 1/2021 | Bshara | G06F 1/329 |
| 12,217,184 B2 * | 2/2025 | Yoo | G06N 3/082 |
| 2019/0332925 A1 * | 10/2019 | Modha | G06N 3/045 |

OTHER PUBLICATIONS

Fujiki, D., Chatterjee, N., Lee, D., & O'Connor, M. (Nov. 2019). Near-memory data transformation for efficient sparse matrix multi-vector multiplication. In Proceedings of the International Conference for High Performance Computing, Networking, Storage and Analysis (pp. 1-17).
Gale, T., Zaharia, M., Young, C., & Elsen, E. (Nov. 2020). Sparse GPU kernels for deep learning. In SC20: International Conference for High Performance Computing, Networking, Storage and Analysis (pp. 1-14). IEEE.
Guo, C., Hsueh, B. Y., Leng, J., Qiu, Y., Guan, Y., Wang, Z., . . . & Zhu, Y. (Nov. 2020). Accelerating sparse dnn models without hardware-support via tile-wise sparsity. In SC20: International Conference for High Performance Computing, Networking, Storage and Analysis (pp. 1-15). IEEE.
Krashinsky, R., Giroux, O., Jones, S., Stam, N., Ramaswamy, S. (May 14, 2020). NVIDIA ampere Architecture in-depth. NVIDIA Developer Blog. Retrieved Sep. 30, 2021, from https://developer.nvidia.com/blog/nvidia-ampere-architecture-in-depth/.
Lawlor, O. S. (Nov. 2013). In-memory data compression for sparse matrices. In Proceedings of the 3rd Workshop on Irregular Applications: Architectures and Algorithms (pp. 1-6).
Mocerino, L. (2017). Data-flow analysis and optimization in Convolutional Neural Networks on-chip (Doctoral dissertation, Politecnico di Torino).
NVIDIA A100 tensor core GPU architecture. https://images.nvidia.com/aem-dam/en-zz/Solutions/data-center/nvidia-ampere-architecture-whitepaper.pdf, 2020.

* cited by examiner

*Primary Examiner* — Brian R Peugh

(57) ABSTRACT

A method includes, in response to receiving a command from a processing device, reading original data from a set of one or more memory devices based on an address range specified in the command, and transmitting a subset of the original data to the processing device, where the subset includes fewer zero values than the original data.

20 Claims, 7 Drawing Sheets

NEAR-MEMORY ENGINE FOR REDUCING BANDWIDTH UTILIZATION IN SPARSE DATA APPLICATIONS

BACKGROUND

In computing, a sparse matrix is a matrix having elements that are mostly zeros, with relatively few nonzero elements. Sparse matrices are useful for modeling computational problems in network theory, numerical analysis, machine learning, and numerous other fields. Computations involving sparse matrices are slow and inefficient when executed using standard dense-matrix algorithms due to the large proportion of zeros, which waste processing resources, memory, and power. In addition, computations involving very large sparse matrices may be infeasible using such standard algorithms.

Some specialized approaches for storing and manipulating sparse matrices take advantage of their sparsity to allow for more efficient computation. For example, one characteristic of sparse matrices is that they are more easily compressed at a high ratio, and thus consume much less memory than similarly-dimensioned dense matrices. Computations can then be performed using the compressed version of the sparse matrix. However, due to the computational cost incurred by the compression process itself, it can be impractical to compress dynamic or frequently changing sparse matrices. In addition, it can be impractical to store moderately sparse matrices in a compressed format due to metadata overhead for identifying the positions of nonzero values. Thus, such moderately sparse matrices may be stored with their zero values explicitly recorded in memory.

BRIEF DESCRIPTION OF THE DRAWINGS

The present disclosure is illustrated by way of example, and not by way of limitation, in the figures of the accompanying drawings.

DETAILED DESCRIPTION

Figure 1:
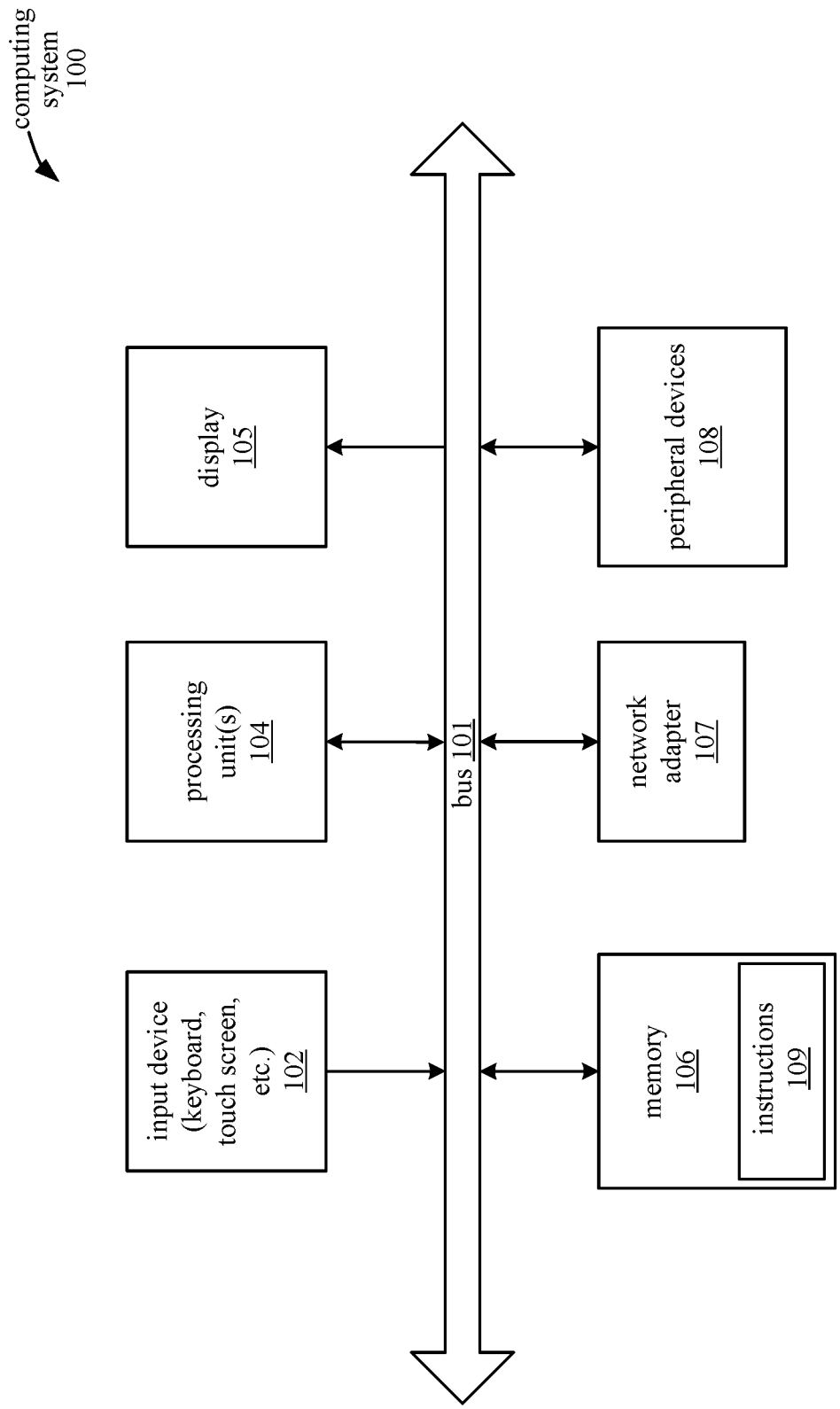
FIG. 1 illustrates a computing system, according to an embodiment.

The following description sets forth numerous specific details such as examples of specific systems, components, methods, and so forth, in order to provide a good understanding of the embodiments. It will be apparent to one skilled in the art, however, that at least some embodiments may be practiced without these specific details. In other instances, well-known components or methods are not described in detail or are presented in a simple block diagram format in order to avoid unnecessarily obscuring the embodiments. Thus, the specific details set forth are merely exemplary. Particular implementations may vary from these exemplary details and still be contemplated to be within the scope of the embodiments.

Moderately-sparse data applications, such as pruned deep neural networks commonly seen in machine learning, often involve reading sparse matrices with a moderate proportion of zeros to nonzero values. Unlike matrices with higher degrees of sparsity, the percentage of nonzero values in these moderately sparse matrices is often not low enough for the programmer to represent them in a dense or compressed format, due to metadata overhead for identifying the positions of nonzero values. Such moderately-sparse matrices seen in machine learning and other applications are therefore represented in an uncompressed format. In other words, the moderately sparse data is stored with both zero and nonzero values explicitly recorded in memory. However, system interconnects are often power and bandwidth limited. Thus, transmitting zeros from the memory modules to compute modules over the system interconnect wastes valuable power and bandwidth, particularly when the zero values have limited computational value.

In one embodiment, a significant reduction in such redundant data movement between a producer memory device (such as dynamic random access memory (DRAM), non-volatile memory (NVM), solid state drive (SSD), etc.) and a consumer device (such as central processing unit (CPU), graphics processing unit (GPU), accelerator etc.) is enabled by implementing an instruction set architecture (ISA) extension that enables a processor to issue a load instruction directed to a range of contiguous addresses such that only non-zero values contained in the range are returned by the memory subsystem. A near-memory zero-skipping memory controller device includes address generation logic for translating the range-based queries into appropriate memory access requests for obtaining the requested data from one or more memory channels, and a near-memory zero-detecting and zero-skipping engine for filtering zero values from the data. A unified interface is thus provided that enables the zero skipping load function to operate over multiple memory devices or memory channels, so that the address range for the nonzero load instruction can span multiple heterogeneous memory devices. As sparsity of the requested data increases, the data movement saved increases correspondingly for 32-bit floating point, 16-bit floating point, and 8 bit integer data types. Due to metadata overhead, the lower the size of the datum, the higher is the sparsity threshold beyond which bandwidth savings are observed.

FIG. 1 illustrates an embodiment of a computing system 100 in which the above-described zero skipping memory controller device is implemented. In general, the computing system 100 is embodied as any of a number of different types of devices, including but not limited to a laptop or desktop computer, mobile device, server, etc. The computing system 100 includes a number of components 102-108 that communicate with each other through a bus 101. In computing system 100, each of the components 102-108 is capable of communicating with any of the other components 102-108 either directly through the bus 101, or via one or more of the other components 102-108. The components 101-108 in computing system 100 are contained within a single physical enclosure, such as a laptop or desktop chassis, or a mobile phone casing. In alternative embodiments, some of the components of computing system 100 are embodied as peripheral devices such that the entire computing system 100 does not reside within a single physical enclosure.

The computing system 100 also includes user interface devices for receiving information from or providing information to a user. Specifically, the computing system 100 includes an input device 102, such as a keyboard, mouse, touch-screen, or other device for receiving information from the user. The computing system 100 displays information to the user via a display 105, such as a monitor, light-emitting diode (LED) display, liquid crystal display, or other output device.

Computing system 100 additionally includes a network adapter 107 for transmitting and receiving data over a wired or wireless network. Computing system 100 also includes one or more peripheral devices 108. The peripheral devices 108 may include mass storage devices, location detection devices, sensors, input devices, or other types of devices used by the computing system 100.

Computing system 100 includes one or more processing units 104, which in the case of multiple processing units 104 are capable of operating in parallel. The processing units 104 receive and execute instructions 109 that are stored in the memory subsystem 106. In one embodiment, each of the processing units 104 includes multiple computing nodes that reside on a common integrated circuit substrate. Memory subsystem 106 includes memory devices used by the computing system 100, such as random-access memory (RAM) modules, read-only memory (ROM) modules, hard disks, and other non-transitory computer-readable media.

Some embodiments of computing system 100 may include fewer or more components than the embodiment as illustrated in FIG. 1. For example, certain embodiments are implemented without any display 105 or input devices 102. Other embodiments have more than one of a particular component; for example, an embodiment of computing system 100 could have multiple buses 101, network adapters 107, memory devices 106, etc.

Figure 2:
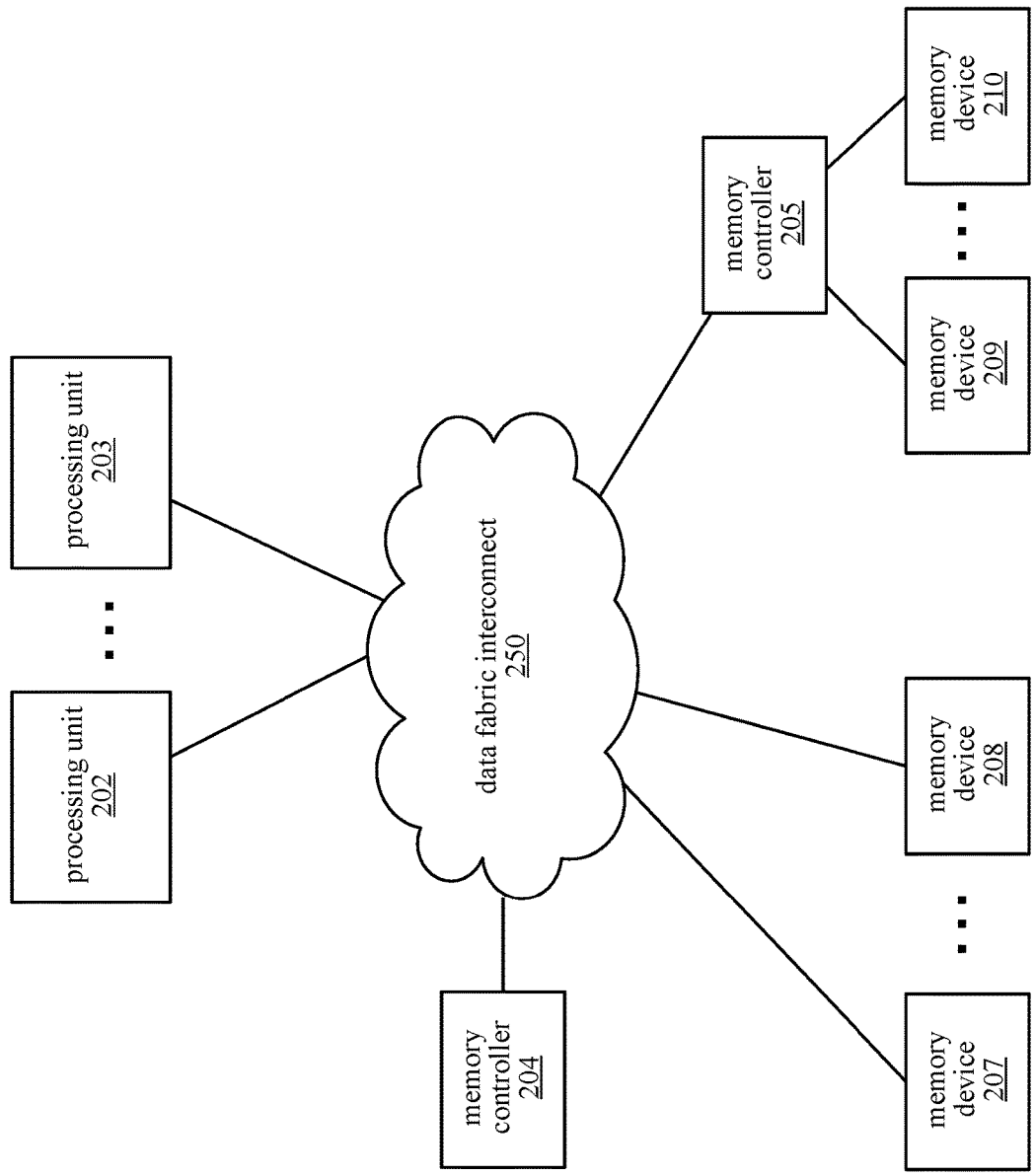
FIG. 2 illustrates computing nodes connected via a data fabric interconnect, according to an embodiment.

FIG. 2 illustrates hardware components of a computing system 100 connected to each other by a data fabric interconnect 250, according to an embodiment. The computing system 100 includes processing devices such as processing units 202-203 (corresponding to processing unit(s) 104) that communicate with other devices in the system 100, such as memory controllers 204-205, via the data fabric interconnect 250. Each of the processing units 202-203 is able to transmit commands to the memory controllers 204 and 205 to request data stored on the memory devices 207-210. In one embodiment, each of the memory controllers 204 and 205 is a zero-skipping memory controller that supports nonzero load instructions. For example, processing unit 202 may send a load nonzero (LDNZ) command to the memory controller 205 requesting all of the nonzero values within a memory address range indicated in the command. The memory controller 205 generates the appropriate memory read requests to obtain the original data in the specified address range from memory devices (e.g., memory devices 209-210), then filters the original data by removing zero values to produce a subset of the data that contains only the nonzero values. The memory controller 205 then returns the nonzero values to the requesting processing unit 202 over the interconnect 250.

As illustrated in FIG. 2, the memory controller 205 does not communicate with the memory devices 209-210 using the interconnect 250, but instead communicates with these devices 209-210 using a separate set of communication channels distinct from the interconnect 250. In one embodiment, the memory controller 205 is situated in a near-memory location in the architecture, such that the link cost (e.g., in terms of latency, bandwidth, etc.) for communications transmitted between the memory controller 205 and each memory device 209-210 is less than the cost for communications transmitted from the any of the processing units 202-203 to the memory controller 205.

The memory controller 204 communicates (e.g., memory requests and returned data) with the memory devices 207-208 via the interconnect 250. In one embodiment, the memory controller 204 is connected to the interconnect 250 in a near-memory location (i.e., nearer to the memory devices 207-208 than the processing units 202-203) so that the link cost for communicating over a portion of the interconnect 250 between the memory controller 204 and the memory devices 207-208 is less than for communicating over a portion of the interconnect 250 between the processing units 202-203 and the memory controller 204.

In one embodiment, the memory devices 207-210 include dynamic random access memory (DRAM) and/or other volatile or nonvolatile memory types such as flash memory, phase change memory, spin transfer torque (STT) memory, etc. In addition to using different memory technologies, the memory devices 207-210 may also have different capacities, command interfaces, etc.

Figure 3:
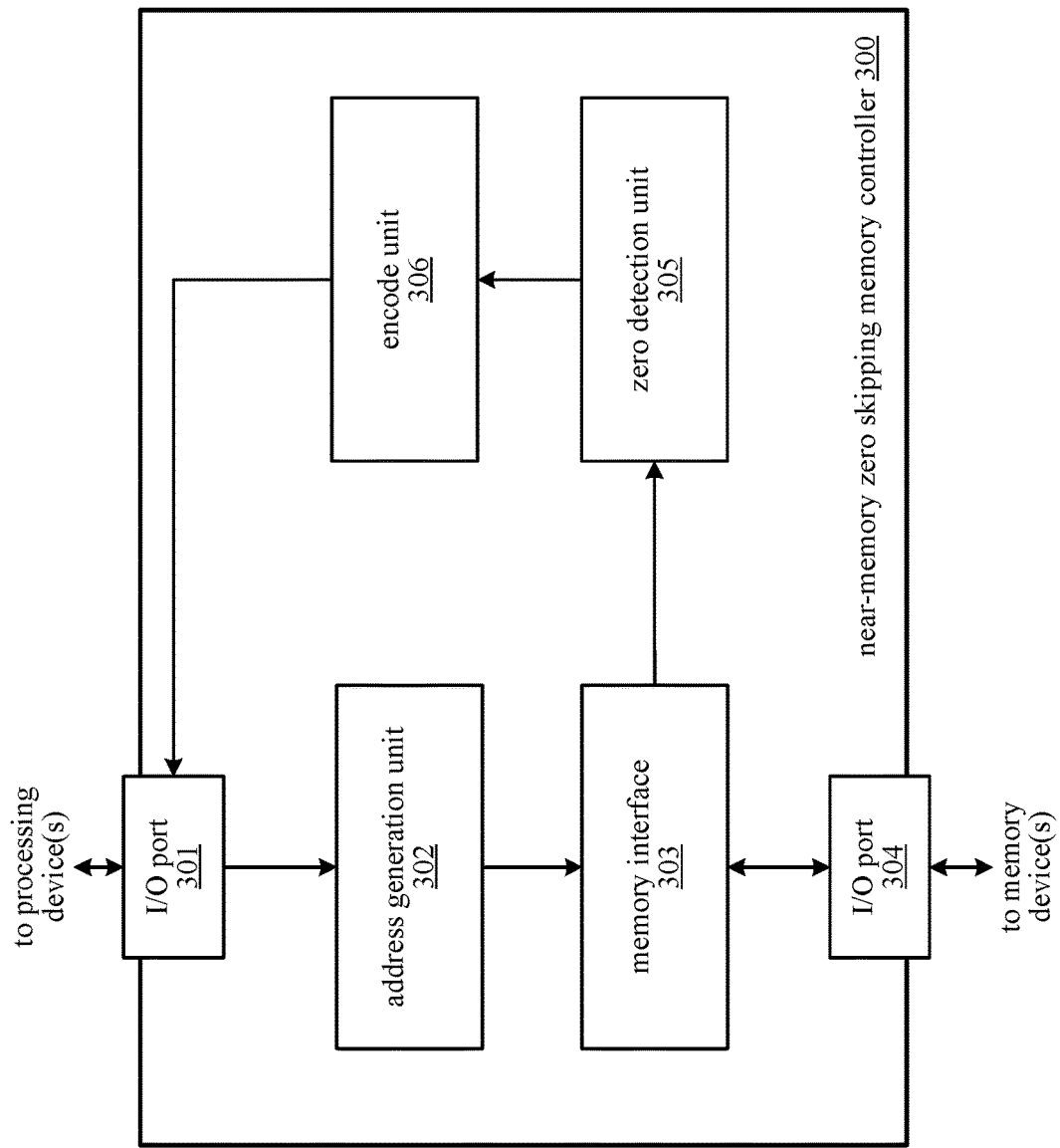
FIG. 3 illustrates components in a zero-skipping memory controller, according to an embodiment.

FIG. 3 illustrates components in a zero skipping memory controller, according to an embodiment. The components in the zero skipping memory controller 300 are implemented as hardware circuitry or a combination of hardware and software and/or firmware. The memory controller 300 may be implemented as either of the memory controllers 204 and 205 illustrated in FIG. 2, and supports the use of an instruction set architecture (ISA) extension that provides a sparse nonzero load (LDNZ) instruction. The LDNZ instruction allows a processor to issue a range of contiguous memory addresses to the memory subsystem, which responds with address-value pairs for nonzero values in the specified range, while excluding zero values. In particular, LDNZ instructions cause the processing unit to send the address range and an associated data size via a command to the zero skipping memory controller 300, which converts the address range to appropriate memory read requests, filters zero values from the original data returned from memory (using the data size for iteration logic and for identifying value boundaries for the zero detection), and returns the nonzero data to the processing unit as key-value pairs.

The memory controller 300 includes an address generation unit 302 that transforms the address range to the appropriate set of memory read requests for requesting the original data from memory devices in the system (e.g., memory devices 207-210). The processor-side I/O port 301 is connected to the interconnect 250 and receives the LDNZ command from the processing unit, and then provides the command to the address generation unit 302. Based on the address range specified in the command, the address generation unit 302 generates a set of memory access requests for accessing each address in the specified address range. In one embodiment, the address generation unit 302 generates memory access requests for multiple different types of memory devices and/or across multiple memory channels. In an alternative embodiment, the address generation unit 302 may generate memory access requests for a subset of the requested address range for which it is responsible; for example, a LDNZ command requesting nonzero values in a requested address range spanning multiple memory devices or channels may be handled by multiple zero skipping memory controllers, each responsible for returning the nonzero values from its assigned memory devices or channels.

The generated memory access requests are provided to the memory interface 303, which reads the requested data from one or more memory devices (e.g., 207-210) by issuing the memory access requests via I/O port 304 to the memory devices. The I/O port 304 may be connected to the memory devices via the data fabric interconnect 250 or via communication channels independent from the interconnect 250. In alternative embodiments, the memory controller can have fewer or more I/O ports. For example, a memory controller may have a single I/O port that performs the functions of both of the ports 301 and 304, or may have additional I/O ports that can communicate with any of the processors, memory devices, and/or other devices connected to the interconnect 250.

In one embodiment, the memory controller 300 supports multiple memory channels such that the memory interface 303 can issue memory requests to multiple memory channels. For example, the memory interface 303 may transmit a first subset of the generated memory access requests to a first memory device via a first communication channel, and transmit a second subset of the memory access requests to a second memory device via a separate second communication channel. In one embodiment, the communications for multiple memory channels are interleaved. When the memory devices receive the access requests, they return the requested data via the data fabric interconnect 250 or other communication channel. Accordingly, the memory interface 303 also receives the original returned data via the memory-side I/O port 304. The memory interface 303 provides the original data to the zero detection unit 305.

The zero detection unit 305 receives the original data from the memory interface 303 and distinguishes the zero and nonzero values in the original data so that the zero values can be removed. The zero detection unit 305 and thus selects the subset of nonzero values for transmitting back to the processing device requesting the LDNZ. In one embodiment, the zero detection unit 305 iterates through each of the original data values and determines whether the value is zero or nonzero. If the value is nonzero, the zero detection unit 305 provides the nonzero value to the encode unit 306, and if the value is zero it is discarded. In one embodiment, the encode unit 306 thus receives all of the nonzero values and none of the zero values from the original data. In alternative embodiments, the zero detection unit 305 mechanism need not remove every zero value from the original data, or may remove a nonzero value instead of zero values, such as the most common nonzero value in the dataset (e.g., removing '1' values from a data set where the most common value is '1').

In an embodiment in which zeros are removed from the original data, the zero detection unit 305 sends each nonzero value and its memory address to the encode unit 306 to cause the encode unit 306 to encode the nonzero value in a key-value pair with an offset of its memory address relative to a base address of the requested address range. The encode unit 306 calculates the offset for the nonzero value by determining a difference between the base address and the memory address of the nonzero value; for example, if the base address of the requested address range is '0x0100', then a nonzero value '0x0F' at address '0x0120' is encoded as the key-value pair (0x0020, 0x0F), where the offset and the nonzero value are the key and value, respectively. In alternative embodiments, the offset is calculated and incremented in the zero detection unit 305, and the encode unit 306 receives the already calculated offset for encoding along with the nonzero value.

The resulting set of key-value pairs encode all of the nonzero values and none of the zero values from the original data obtained from the requested memory address range. Thus, while the keys may contain zeros (e.g., for representing a zero offset), the values in the key-value pairs are nonzero values. This method of packing data values can be performed with low latency and little computational overhead compared to other compression methods and is therefore suitable for providing a quick reduction of the data size in response to the LDNZ request. Since the packing of data values occurs after the processing unit issues the LDNZ command and before the requested data values can be returned, a fast method for packing the values reduces the time that the processing unit waits for the response. In addition, the returned nonzero values can be read and unpacked into their original form by the requesting processing unit without substantial additional processing.

The key-value pairs are transmitted back to the requesting processing unit by the processor-side I/O port 301. In one embodiment, packets are transmitted to the processing unit in packets sent over the interconnect 250 that include the key value pairs, a core identifier of the requesting processing unit, and a base address of the address range in the original LDNZ request.

Figure 4A:
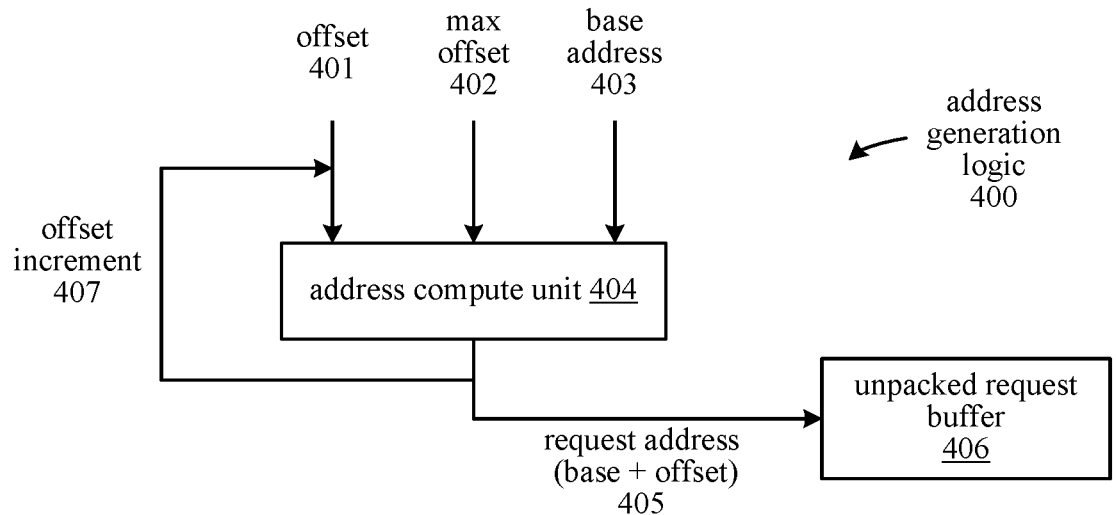
FIG. 4A illustrates address generation logic, according to an embodiment.
Figure 4B:
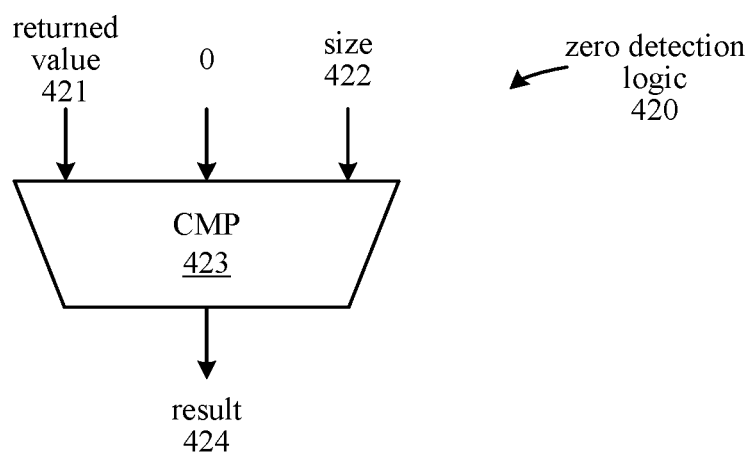
FIG. 4B illustrates zero detection logic, according to an embodiment.

FIG. 4A illustrates address generation logic 400 in the address generation unit 302 for generating memory access requests based on a requested range of memory addresses in a LDNZ command, according to an embodiment. Starting with the base address 403 of the address range requested in the LDNZ command, the address compute unit 404 generates a first request address by adding to the base address 403 an offset 401 corresponding to the size of each request, or to the minimum addressable unit of the memory. A memory request is generated for the address 405 and is stored in the unpacked request buffer 406. Subsequent request addresses are generated by incrementing 407 the offset 401 and adding the incremented offset 401 to the base address 403. Request addresses are generated until the offset 401 reaches the maximum offset 402. Memory requests for the generated request addresses 405 are also stored in the unpacked request buffer 406. The memory requests are then issued from the unpacked request buffer 406 to the memory devices (e.g., DRAM) via the memory-side I/O port 304.

The memory devices respond to the requests by returning original data read from the requested addresses, which may include zero and nonzero values. The zero detection logic 420 includes a comparator (CMP) 423 that compares each of the returned values 421 with zero. The size input 422 determines how many of the returned bits are compared for each value. The result 424 at the output of the comparator 423 is asserted if the value 421 is equal to zero. If the result 424 is deasserted, indicating that the value 421 is nonzero, then the value 421 is sent to the encoding logic 440 to be encoded with its address offset. Otherwise, if the result 424 is asserted, indicating that the value 421 is zero, then the zero value 421 is not encoded, and is discarded.

Figure 4C:
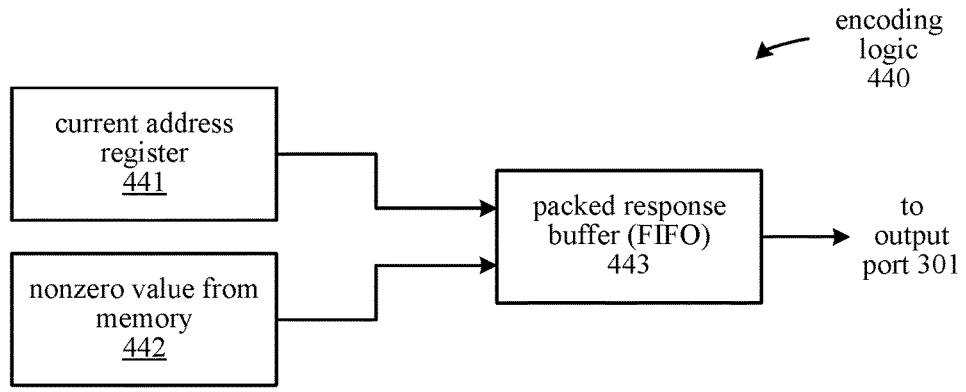
FIG. 4C illustrates logic for encoding nonzero values and addresses, according to an embodiment.

FIG. 4C illustrates encoding logic 440 residing in the encode unit 306, according to an embodiment. The encoding logic 440 encodes a current address from a current address register 441 and a corresponding nonzero value into a key-value pair. The current address register 441 indicates the original address (e.g., recorded as the original address itself, or as an offset relative to the base address) of a zero or nonzero value of the original data. If the result 424 is asserted, indicating that the value 421 is zero, then the zero value is discarded. In one embodiment, the zero value is discarded by incrementing the address value stored in the current address register 441 before making any copies of the zero value or marking the zero value to be copied later. In alternative embodiments, a value may be discarded by deallocating or freeing a register storing the value, overwriting or otherwise destroying the last local copy of the zero value, or otherwise making the value impossible or more difficult to access.

If the result 424 is deasserted, indicating that the value 421 is nonzero, the nonzero value 421 is provided to the encoding logic 440 as nonzero value 442 to be encoded. The current address register 441 provides the address of the nonzero value 442, and the address and the nonzero value 442 are added as the key and value, respectively, of a key value pair to the packed response first-in first-out (FIFO) buffer 443. As a result, the packed response buffer 443 is filled with key-value pairs including the addresses and values for the nonzero values from the original data, and excluding addresses and values for the zero values from the original data. The processor-side I/O port 301 packetizes and transmits the key-value pairs from the packed response buffer 443 to the requesting processing unit via the interconnect 250.

Figure 4D:
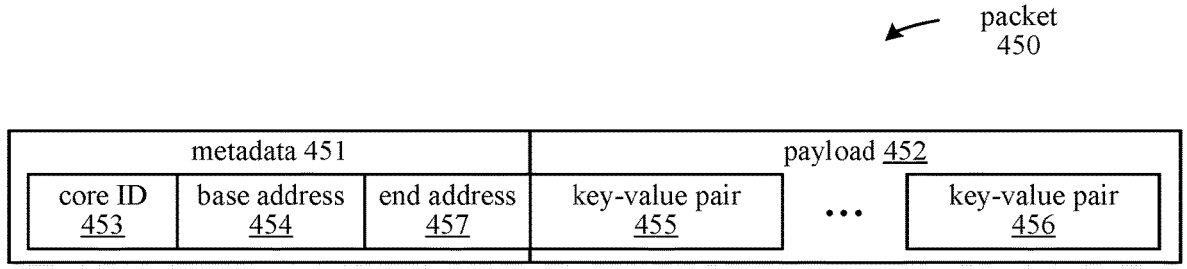
FIG. 4D illustrates a packet for transmitting nonzero values, according to an embodiment.

FIG. 4D illustrates one embodiment of a packet 450 containing key-value pairs for transmitting back to the requesting processing unit. The packet 450 is sized to fit the data width of the interconnect 250. Packet 450 includes a metadata field 451 and a payload 452. The metadata field 451 includes a core identifier 453 that identifies the destination processing unit core of the packet 450, which is the same core from which the LDNZ command originated. The base address 454 is the base (i.e., lowest) address of the address range requested in the original LDNZ command. The payload 452 of the packet 450 includes multiple key-value pairs 455-456, where each key-value pair has a key field that holds the original memory address from which the data value was read, expressed an offset relative to the base address 454, and a value field that holds the nonzero data value. In alternative embodiments, the packet 450 may include fewer or more metadata or payload fields, and/or the field orders may differ. In one embodiment, the metadata fields include an end address field 457 (or a similar field such as an end offset from the base address) that indicates the last address that will be processed by the zero skipping logic. This information is used by the processing unit to determine that the LDNZ has completed.

Figure 5:
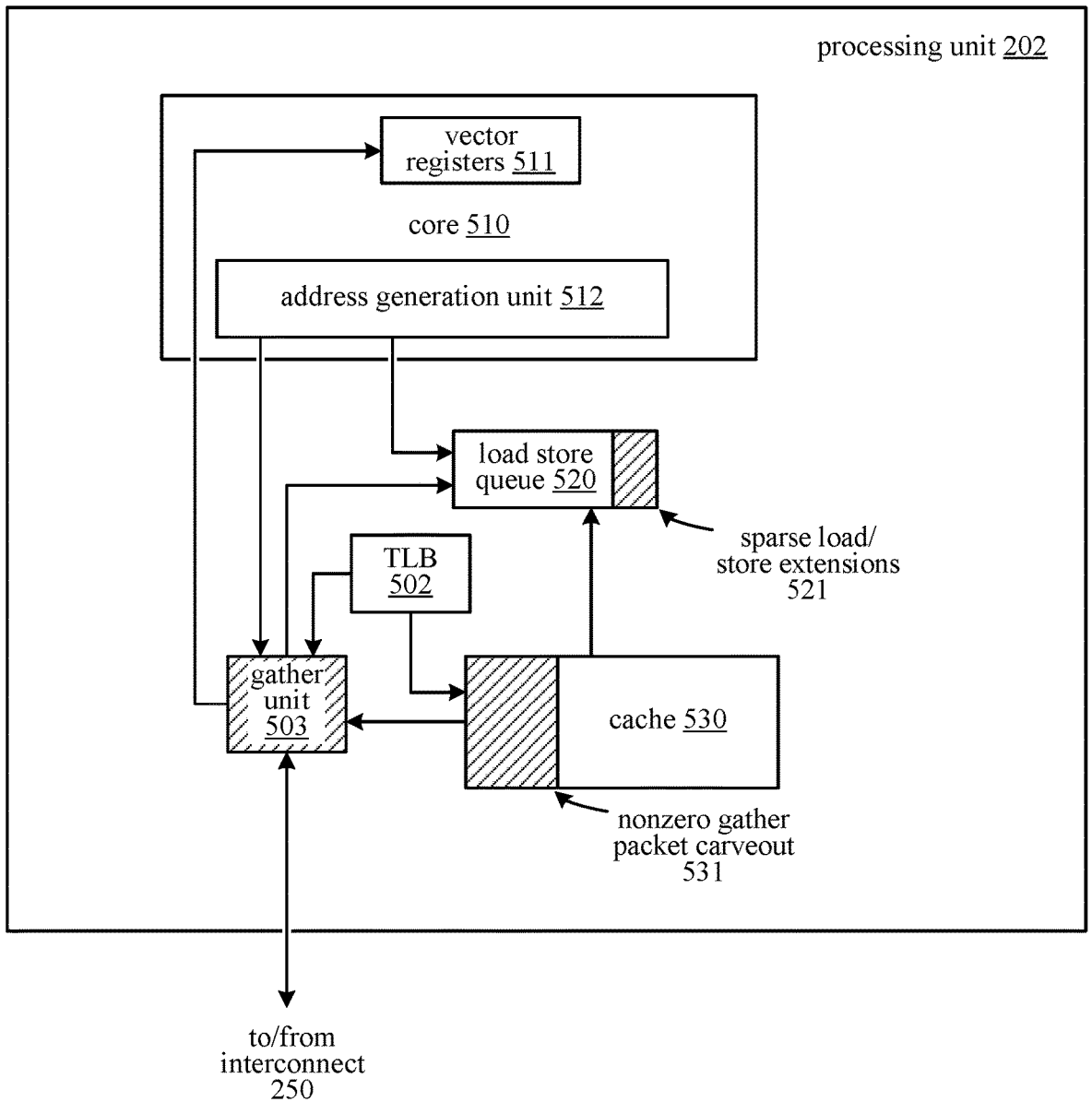
FIG. 5 illustrates components in a processing unit, according to an embodiment.

FIG. 5 illustrates components in a processing unit 202 that supports the LDNZ instruction, according to an embodiment. When executing a LDNZ instruction, the processing unit 202 issues one or more LDNZ commands specifying a requested memory address range or ranges to one or more memory controllers via the interconnect 250. The processing unit 202 then receives packets containing the key-value pairs for nonzero values within the requested address range or ranges, along with their addresses (e.g., in the form of offsets relative to a base address of the requested address range).

When a LDNZ instruction is executed in the processing unit 202, the main memory addresses for the address range being requested are calculated by the address generation unit 512 and provided to the load/store queue 520. The load/store queue 520 in the processing unit keeps track of load and store operations directed to registers (e.g., vector registers 511) in the processor core 510. The load/store queue 520 ensures that load and store operations occur in program order even if instructions are executed out of order. In addition to cache line based loads, the load/store queue 520 also supports address range loads such as LDNZ loads, which are identified in the load/store queue 520 by additional metadata in the sparse load/store extensions 521; for example, the extensions 521 may include an additional bit for each entry in the load/store queue 520 that, when asserted, indicates that the entry represents an address range load of nonzero sparse values rather than a cache line based load. When the LDNZ command is issued, an address range load entry is added to the load/store queue 520 for tracking the completion of the LDNZ command.

For a computing system having a single memory channel, the LDNZ command is sent to the memory controller associated with the single memory channel. However, when the system has multiple memory channels, the LDNZ command is broken into multiple LDNZ commands each specifying a sub-transaction address range, and each LDNZ command is sent to a memory controller associated with one of the multiple memory channels via the interconnect 250. In one embodiment, the sub-transaction address ranges are contiguous non-overlapping ranges that together cover the entire address range that was originally requested.

When the LDNZ commands have been thus scattered to multiple memory channels, a near-processor gather unit 503 assembles the encoded key-value pairs that are returned from each memory channel. The gather unit 503 keeps track of the sub-transaction LDNZ commands and the memory channels to which they were sent. The gather unit 503 receives the nonzero values (in packets containing key/value pairs) returned from the memory channels over the interconnect 250, and keeps track of which data has been returned based on the base addresses for each sub-transaction range.

The gather unit 503 stores the nonzero values in the cache 530 as they are returned. The cache 530 receives the nonzero values in a nonzero gather packet carveout area 531, in which the values are stored. In one embodiment, each of the nonzero values is stored in the carveout area 531 according to its original order in memory. That is, each nonzero value is stored in a location corresponding to its associated offset (i.e., the key in the key-value pair) so that the values are represented in address order even if when the packets are received out of order.

The gather unit 503 tracks the receipt of the requested data and, when all of the data is received, the gather unit 503 signals the load/store queue 520 that all of the nonzero values in the requested address range were received in the cache 530. The nonzero values are then copied to the registers 511, and the address range load is retired in the load/store queue 520. Upon this indication in the load/store queue 520 that the LDNZ command has completed, the nonzero values now stored in the registers 511 can be accessed according to further instructions executing in the processor core 510.

Figure 6:
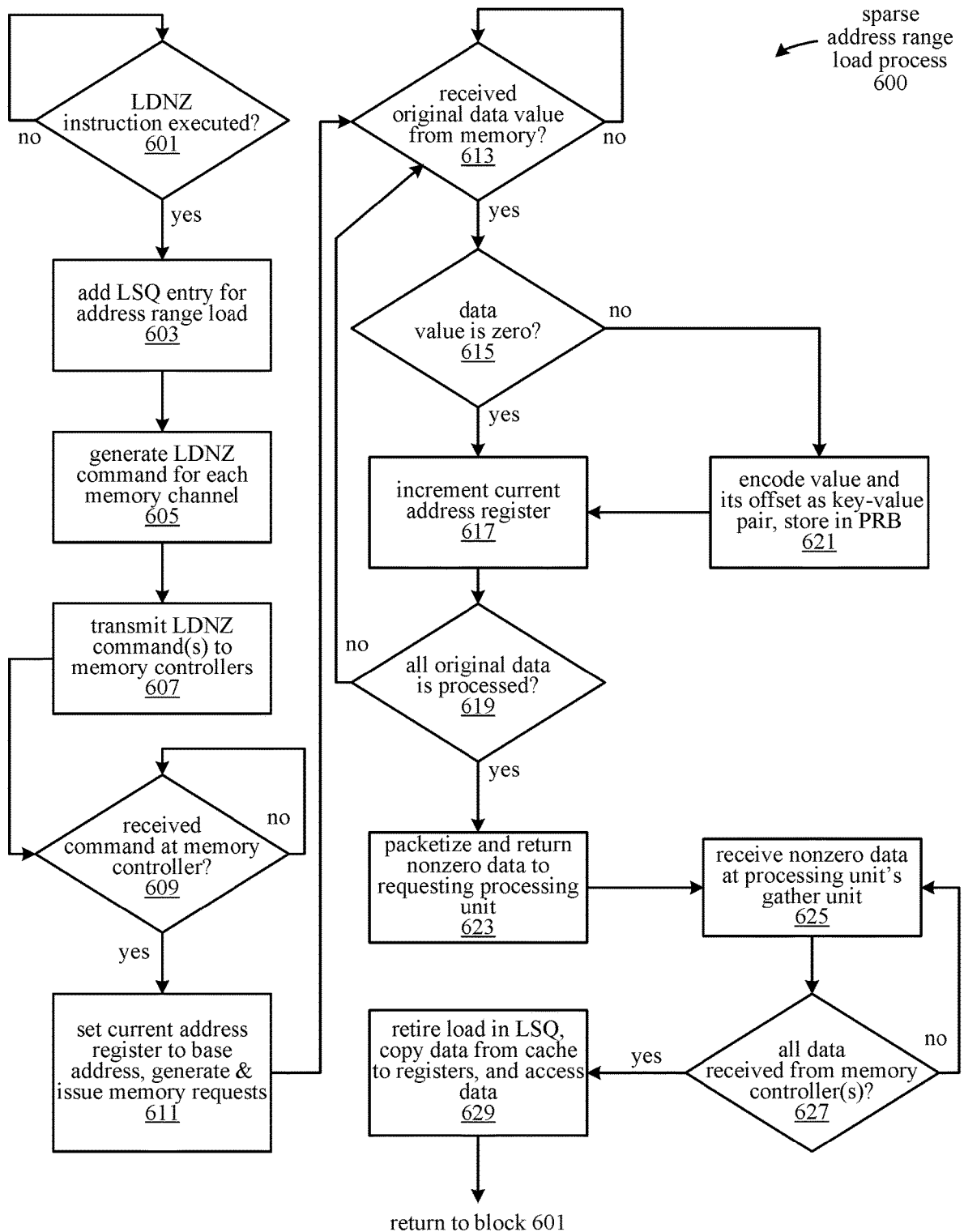
FIG. 6 illustrates a process for performing a load of sparse nonzero values from an address range, according to an embodiment.

FIG. 6 illustrates a process 600 for performing an address range load of sparse values, according to an embodiment. The process 600 is performed by components of the computing system 100, such as the processing unit(s) 202-203 and memory controllers 204 and 205.

In one embodiment, an ISA extension provides a LDNZ instruction that can be executed in a processing unit (e.g., processing unit 202). The LDNZ instruction specifies an address range from which nonzero values are requested. For structured sparse matrices, the width of the destination is known ahead of time, and the elements can be loaded into a vector register (e.g., vector register 511) designated for structured sparse matrices. For unstructured sparse elements, the destination of the load may be scratchpad memory, such as the carveout area 531 in the cache 530, which acts as a staging area. When all of the data is received, the elements are subsequently loaded into registers (e.g., registers 511) via indexing. In one embodiment, the requested address range may be restricted to a page and the address translation mechanism uses the translation lookaside buffer (TLB) 502.

At block 601, the process 600 waits until a LDNZ instruction is executed in the processing unit 202 that specifies a memory address range from which to load nonzero values. The process 600 then proceeds to block 603 to start performing the requested load of nonzero values from the specified address range.

At block 603, the processor core 510 executing the LDNZ instruction adds a sparse address range load entry in the load/store queue (LSQ). In one embodiment, metadata (i.e., in the sparse load/store extensions 521) is updated to indicate that the entry is for a sparse address range load, rather than a normal cache-line based load.

In one embodiment, the physical address range of the sparse address range load is issued to the memory controller, bypassing the caches. On multichannel systems, the LDNZ is broken into multiple sub-transaction ranges and sent to the memory controllers (e.g., 204 and 205) via the system interconnect 250. Accordingly, at block 605, the initial requested address range is divided into multiple sub-transaction address ranges, and a LDNZ command is generated for each of the sub-transaction address ranges. In one embodiment, a LDNZ command is generated for each memory channel, where the LDNZ command for a channel specifies a sub-transaction address range representing only the portion of the originally requested address range that can be accessed via the channel. The sub-transaction address ranges together cover the entire originally requested address range. Accordingly, the memory accesses performed for the LDNZ instruction can be interleaved over the multiple channels to reduce latency by accessing memory channels in parallel.

At block 607, each of the LDNZ commands is transmitted over the interconnect 250 to a respective zero skipping memory controller (e.g., memory controllers 204 or 205), where each memory controller is associated with a different memory channel. In the following description, process 600 will be described for one LDNZ command, which can represent a single LDNZ command generated for the instruction in a single memory channel system, or can represent one of the multiple LDNZ commands generated for executing the LDNZ instruction in a multichannel memory system.

At block 609, the memory controller waits until it receives a LDNZ command, then the process 600 continues at block 611. At block 611, the memory controller sets the current address register 441 to the base address of the address range indicated in the LDNZ command, or to zero (in an embodiment where the current address register 441 stores an offset relative to the base address). In addition, the memory controller at block 611 also reads original data from a set of one or more memory devices based on the address range specified in the LDNZ command. The address generation unit 302 generates a set of memory read requests covering each of the addresses in the range. The memory controller then reads the data from memory devices by issuing the memory read requests to the memory devices. For example, with reference to FIG. 4A, the address compute unit 404 generates request addresses 405 to generate read requests that are stored in the unpacked request buffer 406. The requests are then issued from the unpacked request buffer to the memory devices via the memory-side I/O port 304.

In one embodiment, the memory requests are transmitted in packets over the interconnect 250 to the destination memory devices. An interconnect width-sized packet is reserved for the read requests, which is retired when the maximum packet size is reached (common case) or when a timeout is reached (once per instruction) indicating that no more memory requests are forthcoming. Instead of a timeout, alternative embodiments may retire the requests in response to end-of-packet marker bits, a specialized ACK packet etc.

At block 613, the memory controller waits until the original data requested from the memory device or devices is returned (e.g., via packets arriving at the memory-side I/O port 304). Typically, multiple data values are returned for each memory read request. For example, high bandwidth memory (HBM) requests return 32 bytes and integer data is 4 bytes, so 8 integer values are returned for each HBM request. A subset of the returned values can be zero. In one embodiment, the zero detection unit 305 iterates through individual values after the data values corresponding to a single memory request are received by the memory controller 300.

When one of the returned data values (which corresponds to the address in the current address register) is received by the zero detection unit 305, the process 600 continues at block 615 to determine whether the value is a zero or nonzero value. At block 615, if the value is zero, then it is discarded or ignored. The process 600 continues from block 615 to block 617 in this case. At block 617, the current address register 441, which indicates the address of the value that was determined to be zero, is incremented so that it indicates the address of the next value to be checked.

At block 619, the zero detection unit 305 determines whether or not all of the data values have been processed to check whether they are zero or nonzero. In one embodiment, the current address register is compared with the address range requested in the LDNZ command. If the current address register is still within the address range, then all of the original data has not yet been processed. At block 619, if all of the original data values have not yet been processed, then the process 600 returns to block 613 to continue checking the incoming data values.

At block 613, the zero detection unit 305 waits until it receives the next original data value, which corresponds to the address in the current address register 441 previously incremented at block 617. At block 615, the value is compared with zero and, if the data value is not zero, then the process 600 continues at block 621. At block 621, zero detection logic 420 causes the encoding logic 440 to encode the nonzero value 442 and its address (obtained from the current address register 441) as a key-value pair stored in the packed response buffer (PRB) 443.

In one embodiment, the address associated with the nonzero value is encoded as an offset relative to the base address or the address range requested in the LDNZ command. In one embodiment where the current address register 441 stores the original address for the value, the offset may be calculated by determining a difference between the original address obtained from the current address register 441 and the base address of the requested address range. In alternative embodiments where the address of the value is stored in the current address register 441 as an offset relative to the base address, the offset is available for encoding without further calculation.

At block 617, the current address register 441 is incremented to indicate the address of the next value to be checked. At block 619, if all of the original data has been processed (e.g., the current address register 441 indicates an address outside the requested address range), then the process 600 continues at block 623.

At block 623, the key-value pairs are assembled into packets to be transmitted back to the processing unit originally requesting the LDNZ. Due to the operations of blocks 613-619, the set of packets that is returned to the requesting core includes a subset of the original data read from the requested address range, where this subset includes all nonzero values and excludes all zero values in the address range. In alternative embodiments, the process 600 does not necessarily exclude all of the zero values in the requested address range.

In one embodiment, each packet 450 in the set of packets that is returned to the processing unit carries a portion of the generated key-value pairs 455-456 in its payload 452. Each packet also contains metadata 451, including a core identifier 453 that identifies the destination processing unit core from which the original LDNZ originated and the base address 454 of the address range requested in the original LDNZ command. The packets are transmitted to the requesting processing unit core via the interconnect 250.

The packets are routed back to the requesting processor core through the interconnect 250 using the core identifier 453. At block 623, the near-processor gather unit 503 receives the packets and extracts the nonzero data from the packets using the base address metadata fields and returns the addresses and values of the non-zero values contained in the address range originally requested by the LDNZ. The gather unit 503 stores the nonzero values in the nonzero gather packet carveout area 531 of the cache 530. At block 627, if all of the data has not yet been received, then the process 600 continues to receive data as provided at block 625. The gather unit 503 keeps track of which data from the originally requested address range has been received. The gather unit 503 tracks completion progress of the LDNZ command by tracking individual address ranges processed by each packet as indicated by its metadata field (e.g., the base address 454 and end address 457). The LDNZ is complete when packets have been received covering all of the originally requested address range. In one embodiment, the gather unit 503 additionally keeps track of the completion progress of multiple sub-transactions to different memory devices. When the LDNZ is complete, the gather unit 503 updates the metadata associated with the corresponding entry for the address range load in the load/store queue 520 to indicate the completion of the LDNZ command.

When all the data has been received and stored in the cache, the process 600 continues from block 627 to block 629. The data is moved to the vector registers 511 of the requesting core 510, where the nonzero data can be accessed by further instructions executed by the core 510. The entry for the corresponding LDNZ instruction (previously added at block 603) is also retired in the load/store queue 520. From block 629, the process 600 returns to block 601 to wait for the next LDNZ instruction to be executed. The process 600 thus repeats blocks 601-629 to return nonzero values within the requested address range for each LDNZ instruction that is executed. The process 600 can, in various embodiments, be performed by various types of processing units (e.g., CPU, GPU, field programmable gate array (FPGA), etc.) and memory devices (e.g., DRAM, NVM, etc.). A single LDNZ instruction may obtain nonzero values from a single type of memory or multiple types of memory, and across multiple memory channels or a single channel.

As used herein, the term "coupled to" may mean coupled directly or indirectly through one or more intervening components. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Certain embodiments may be implemented as a computer program product that may include instructions stored on a non-transitory computer-readable medium. These instructions may be used to program a general-purpose or special-purpose processor to perform the described operations. A computer-readable medium includes any mechanism for storing or transmitting information in a form (e.g., software, processing application) readable by a machine (e.g., a computer). The non-transitory computer-readable storage medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory, or another type of medium suitable for storing electronic instructions.

Additionally, some embodiments may be practiced in distributed computing environments where the computer-readable medium is stored on and/or executed by more than one computer system. In addition, the information transferred between computer systems may either be pulled or pushed across the transmission medium connecting the computer systems.

Generally, a data structure representing the computing system 100 and/or portions thereof carried on the computer-readable storage medium may be a database or other data structure which can be read by a program and used, directly or indirectly, to fabricate the hardware including the computing system 100. For example, the data structure may be a behavioral-level description or register-transfer level (RTL) description of the hardware functionality in a high level design language (HDL) such as Verilog or VHDL. The description may be read by a synthesis tool which may synthesize the description to produce a netlist including a list of gates from a synthesis library. The netlist includes a set of gates which also represent the functionality of the hardware including the computing system 100. The netlist may then be placed and routed to produce a data set describing geometric shapes to be applied to masks. The masks may then be used in various semiconductor fabrication steps to produce a semiconductor circuit or circuits corresponding to the computing system 100. Alternatively, the database on the computer-readable storage medium may be the netlist (with or without the synthesis library) or the data set, as desired, or Graphic Data System (GDS) II data.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be in an intermittent and/or alternating manner.

In the foregoing specification, the embodiments have been described with reference to specific exemplary embodiments thereof. It will, however, be evident that various modifications and changes may be made thereto without departing from the broader scope of the embodiments as set forth in the appended claims. The specification and drawings are, accordingly, to be regarded in an illustrative sense rather than a restrictive sense.

What is claimed is:

1. A computing device, comprising
address generation circuitry configured to receive a command from a processing device;
a memory interface coupled with the address generation circuitry and configured to read original data from a set of one or more memory devices based on an address range specified in the command; and
zero detection circuitry coupled with the memory interface and configured to, in response to the command, select a subset of the original data for transmitting to the processing device, wherein the subset includes fewer zero values than the original data.

2. The computing device of claim 1, wherein:
the subset of the original data includes all nonzero values included in the original data; and
the subset of the original data includes no zero values.

3. The computing device of claim 1, wherein:
the address generation circuitry is further configured to, based on the address range specified in the command, generate a plurality of memory access requests for accessing each address in the address range; and
the memory interface is further configured to issue the plurality of memory access requests to the set of one or more memory devices.

4. The computing device of claim 1, further comprising:
encode circuitry coupled with the zero detection circuitry, wherein the zero detection circuitry is further configured to, for each value of the original data from the set of one or more memory devices,
in response to determining that the value is a zero value, discarding the value, and
in response to determining that the value is a nonzero value, causing the encode circuitry to obtain an offset associated with the value for encoding an address of the value relative to a base address of the address range.

5. The computing device of claim 1, further comprising:
an interconnect port coupled with the zero detection circuitry and configured to transmit the subset of the original data to the processing device by:
transmitting a base address of the address range to the processing device, and
for each nonzero value of the original data,
transmitting the nonzero value, and
transmitting an offset associated with the nonzero value, wherein the offset indicates a memory address of the nonzero value relative to the base address.

6. A method, comprising:
in response to receiving a command from a processing device,
reading original data from a set of one or more memory devices based on an address range specified in the command; and
transmitting a subset of the original data to the processing device, wherein the subset includes fewer zero values than the original data.

7. The method of claim 6, further comprising:
generating the subset of the original data by including all nonzero values of the original data in the subset and excluding all zero values of the original data from the subset.

8. The method of claim 6, wherein reading the original data comprises:
based on the address range specified in the command, generating a plurality of memory access requests for accessing each address in the address range; and
issuing the plurality of memory access requests to the set of one or more memory devices.

9. The method of claim 6, further comprising:
in the processing device, generating the command by dividing an initial requested address range into a plurality of sub-transaction address ranges each indicated by one of a plurality of commands, wherein the plurality of commands includes the command and the plurality of sub-transaction address ranges includes the address range.

10. The method of claim 6, further comprising, for each value of the original data from the set of one or more memory devices:
in response to determining that the value is a nonzero value, obtaining an offset associated with the value for encoding an address of the value relative to a base address of the address range; and
in response to determining that the value is a zero value, discarding the value.

11. The method of claim 6, wherein transmitting the subset of the original data to the processing device comprises:
transmitting a base address of the address range to the processing device, and
for each nonzero value of the original data,
transmitting the nonzero value, and
transmitting an offset associated with the nonzero value, wherein the offset indicates a memory address of the nonzero value relative to the base address.

12. The method of claim 6, further comprising:
at the processing device, receiving a plurality of nonzero values of the transmitted subset of the original data in a cache;
in response to the receiving of the plurality of nonzero values, updating a load/store queue of the processing device to indicate a completion progress of the command; and
in response to completion of the command, accessing the plurality of nonzero values.

13. A system, comprising:
a processing device configured to transmit a command; and
a zero skipping memory controller coupled with the processing device via an interconnect fabric and configured to:
in response to receiving the command from the processing device,
reading original data from a set of one or more memory devices based on an address range specified in the command; and
transmitting a subset of the original data to the processing device, wherein the subset includes fewer zero values than the original data.

14. The system of claim 13, wherein:
the zero skipping memory controller is coupled to the set of one or more memory devices via the interconnect fabric, wherein a link cost for a first portion of the interconnect fabric between the zero skipping memory controller and the set of one or more memory devices is less than a link cost for a second portion of the interconnect fabric between the processing device and the zero skipping memory controller.

15. The system of claim 13, wherein the processing device is further configured to:
   divide an initial requested address range into a plurality of sub-transaction address ranges each indicated by one of a plurality of commands, wherein the plurality of commands includes the command and the plurality of sub-transaction address ranges includes the address range; and
   transmit each of the plurality of commands to a respective one of a plurality of zero skipping memory controllers, wherein the plurality of zero skipping memory controllers includes the zero skipping memory controller, and each of the plurality of zero skipping memory controllers is associated with a different memory channel.

16. The system of claim 13, wherein:
   the processing device further comprises a cache device configured to receive a plurality of nonzero values of the transmitted subset of the original data.

17. The system of claim 16, wherein the processing device further comprises gather circuitry configured to:
   receive the transmitted subset of the original data in a plurality of packets transmitted via the interconnect fabric;
   for each nonzero value of a plurality of nonzero values in the transmitted subset of the original data, store the nonzero value in a location in the cache device based on an offset associated with the nonzero value; and
   in response to an indication that all nonzero values in the address range have been stored in the cache device, copy the plurality of nonzero values from the cache device to registers of the processing device.

18. The system of claim 13, wherein the processing device further comprises:
   a load/store queue configured to indicate a completion progress of the command; and
   a processor core configured to, when the load/store queue indicates completion of the command, access one or more nonzero values in the subset.

19. The system of claim 13, wherein the zero skipping memory controller comprises:
   address generation circuitry configured to, based on the address range specified in the command, generate a plurality of memory access requests for accessing each address in the address range; and
   a memory interface configured to issue the plurality of memory access requests to the set of one or more memory devices.

20. The system of claim 13, wherein the zero skipping memory controller is further configured to transmit the subset of the original data to the processing device by:
   transmitting a base address of the address range to the processing device, and
   for each nonzero value of the original data,
      transmitting the nonzero value, and
      transmitting an offset associated with the nonzero value, wherein the offset indicates a memory address of the nonzero value relative to the base address.

* * * * *